United States Patent
Dwivedi et al.

(10) Patent No.: US 11,341,098 B1
(45) Date of Patent: May 24, 2022

(54) NEAR LOSSLESS COMPRESSION OF ATMOSPHERIC DATA

(71) Applicant: Centre for Development of Advanced Computing, Maharashtra (IN)

(72) Inventors: Arun Kumar Dwivedi, Maharashtra (IN); Prateek Maheshwari, Maharashtra (IN); Sahidul Islam, Maharashtra (IN); Neelesh Kharkar, Maharashtra (IN); Akshara Kaginalkar, Maharashtra (IN)

(73) Assignee: CENTRE FOR DEVELOPMENT OF ADVANCED COMPUTING, Maharashtra (IN)

( * ) Notice: Subject to any disclaimer, the term of this patent is extended or adjusted under 35 U.S.C. 154(b) by 0 days.

(21) Appl. No.: 17/226,469

(22) Filed: Apr. 9, 2021

(51) Int. Cl.
*G06F 16/174* (2019.01)
*H03M 7/46* (2006.01)
*H03M 7/30* (2006.01)

(52) U.S. Cl.
CPC ...... *G06F 16/1744* (2019.01); *H03M 7/3064* (2013.01); *H03M 7/3088* (2013.01); *H03M 7/46* (2013.01)

(58) Field of Classification Search
USPC .............................................. 341/50, 51, 87
See application file for complete search history.

(56) References Cited

U.S. PATENT DOCUMENTS 9,628,107 B2 * 4/2017 Dickie .................... H03M 7/24

* cited by examiner

*Primary Examiner* — Khai M Nguyen
(74) *Attorney, Agent, or Firm* — Tucker Ellis LLP

(57) ABSTRACT

The present disclosure relates to a system and method for compressing a dataset. The dataset can be divided in to a plurality of groups. Each group can be converted independently into corresponding text file using dictionary coding technique. The corresponding text files can be compressed independently into corresponding compressed files. Finally, all the corresponding compressed files can be combined together to generate a complete compressed data.

9 Claims, 5 Drawing Sheets

NEAR LOSSLESS COMPRESSION OF ATMOSPHERIC DATA

TECHNICAL FIELD

The present disclosure relates to the field of compression of atmospheric data. More particularly the present disclosure relates to near lossless compression of the atmospheric data.

BACKGROUND

Background description includes information that may be useful in understanding the present invention. It is not an admission that any of the information provided herein is prior art or relevant to the presently claimed invention, or that any publication specifically or implicitly referenced is prior art.

Computational power has been increased significantly that allowed high resolution numerical models simulations to be performed. These high-resolution models solve the many problems in weather and climate. On the other-hand it also causes the model output size to grow enormously. This huge amount of data generated causes critical issues such as strain storage resources, data transmission, and data handling in post-analysis. One of the most effective and attractive solutions for these problems is data compression. It enables us to reduce the data significantly while all the critical information being available for analysis and research opportunities.

Compression can be broadly classified in lossless compression and lossy compression. In lossless compression 100% of the information is preserved, it offers us a limited compression factor which is very less as compared to the requirement. Second approach is lossy compression where the controlled loss can be introduced in the datasets. It can also fulfil the user requirement in terms of data accuracy and very good compression ratio can be obtained. There are many tools are freely available in open domain such as bzip2, 7z, WinZip. Atmospheric data stored in various file formats like NetCDF-3, NetCDF-4, HDF5, GRIB, GRIB2 etc. JPG and PNG compression is generally used in these formats to compress and decompress the data. The most compressed form of data is GRIB2 format which is generally used to store and to transmit the data. Data is stored in binary form in this format. It is a table dependent format therefore a user can't interpret this data on his own. He has to use some tables to get the details of a GRIB2 file. Further. If user wants to compress this GRIB2 format with the help of freely available third-party tool, he will not get any success as any further compression would not work on GRIB2 format.

There is, therefore, a need of an improved compression technique that is capable of further reducing size of the GRIB format dataset significantly.

OBJECTS OF THE PRESENT DISCLOSURE

Some of the objects of the present disclosure, which at least one embodiment herein satisfies are as listed herein below.

It is an object of the present disclosure to provide a system and method for compressing sea level pressure data which is capable of further compressing GRIB2 format data.

It is an object of the present disclosure to provide a system and method for compressing sea level pressure data which is more efficient.

It is an object of the present disclosure to provide a system and method for compressing sea level pressure data which is cost effective in terms of storage space required to store data.

It is an object of the present disclosure to provide a system and method for compressing sea level pressure data which is easy to implement using already existing compression technique.

SUMMARY

The present disclosure relates to the field of compression of atmospheric data. More particularly the present disclosure relates to near lossless compression of the atmospheric data.

An aspect of the present disclosure pertains to a system for compression of a dataset having a plurality of data values. The system includes a processor coupled with a memory, the memory storing instructions executable by the processor to convert the plurality of data values in a first format to a second format. The second format is floating-point value format. Cluster a first segment of each of the plurality of data values in a first group, a second segment of each of the plurality of data in a second group, and a third segment of each of the plurality of data values in a third group. The first group, the second group, and the third group can also be interchangeable used as first bucket, second bucket, and third bucket. The clustering of the first segments, the second segment, and the third segment can be interchangeably referred as bucketing. The first segment has common bits up to a length starting from a most significant bit of the plurality of data values before floating point, and the second segment has remaining bit of the plurality of data values before the floating point, and the third segment has bits of the plurality of data values after the floating point. The first segment of each of the plurality of data values lies within a first pre-defined range, the second segment of each of the plurality of data values lies within a second pre-defined range, the third segment of each of the plurality of data values lies within a third pre-defined range. Encode the first group, the second group, and the third group independently using a first technique to generate a corresponding first text file, second text file, and third text file. Compress the first text file, the second text file, and the third text file independently to generate a corresponding first compressed file, second compressed file, and third compressed file using a second technique. Combine the first compressed file, the second compressed file, and the third compressed file to generate a complete compressed dataset.

In an aspect, the plurality of data values may be very close to each other such that the plurality of data value when converted into floating point value format have at least two-bit common value, starting from the most significant bit, before the floating point. The first technique may include dictionary encoding technique. The first segment may be converted in to the first text file using first dictionary coding having range same as the pre-defined first range, the second segment may be converted in to the second text file using second dictionary coding having range same as the pre-defined second range, and the third segment may be converted in to third text file using third dictionary coding having range same as the pre-defined third range. The third group may be configured to accommodate the bits, up to two decimal places, of the plurality of data values after the floating point. The second technique may include Run length Encoding followed by 7z technique.

In an aspect, the complete compressed data may be converted back in to the dataset having plurality of data values, by executing instruction stored in the memory that causes the processor to decompress the compressed data into the first text file, the second text file, and the third text file using the second technique. Decode the first text file, and the second text file, and the third file to generate the corresponding first segment of the second format, the second segment of the second format, and the third segment of the second point format using the first technique. The first segment may be in the first group, the second segment may be in the second group, and the third segment may be in the third group. Separating the first segment, the second segment, and the third segment from the first group, the second group, and the third group. Combine the first segment, the second segment, and the third segment to generate the dataset having plurality of data values.

Yet another aspect of the present disclosure relates to a method for compression of a dataset having a plurality of data values. The method includes converting, by a processor, the plurality of data values into a floating-point value format. Clustering, by the processor, a first segment of each of the plurality of data values in a first group, a second segment of each of the plurality of data in a second group, and a third segment of each of the plurality of data values in a third group. The first segment has common bits up to a length starting from a most significant bit of the plurality of data values before floating point, and the second segment has remaining bit of the plurality of data values before the floating point, and the third segment has bits of the plurality of data values after the floating point. Encoding, by the processor, the first group, the second group, and the third group independently using a first technique to generate a corresponding first text file, second text file, and third text file. Compressing, by the processor, the first text file, the second text file, and the third text file independently to generate a corresponding first compressed file, second compressed file, third compressed file using a second technique. Combining, by the processor, the first compressed file, the second compressed file, and the third compressed file to generate a complete compressed dataset. The first segment of each of the plurality of data values lies within a first pre-defined range, the second segment of each of the plurality of data values lies within a second pre-defined range, the third segment of each of the plurality of data values lies within a third pre-defined range In an aspect, the complete compressed data may be converted back into original sea level pressure data having plurality of data values by decompress the compressed data into the first text file, the second text file, and the third text file using Run length Decoding followed by 7z decompression technique. Decoding the first text file, and the second text file, and the third file to generate the corresponding first segment of the second format, the second segment of the second format, and the third segment of the second point format using dictionary decoding technique, wherein the first segment is in the first group, the second segment is in the second group, the third segment is in the third group. Separating the first segment, the second segment, and the third segment from the first group, the second group, and the third group. Combining the first segment, the second segment, and the third segment to generate the dataset having plurality of data values.

Various objects, features, aspects and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure. The diagrams are for illustration only, which thus is not a limitation of the present disclosure.

In the figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1:
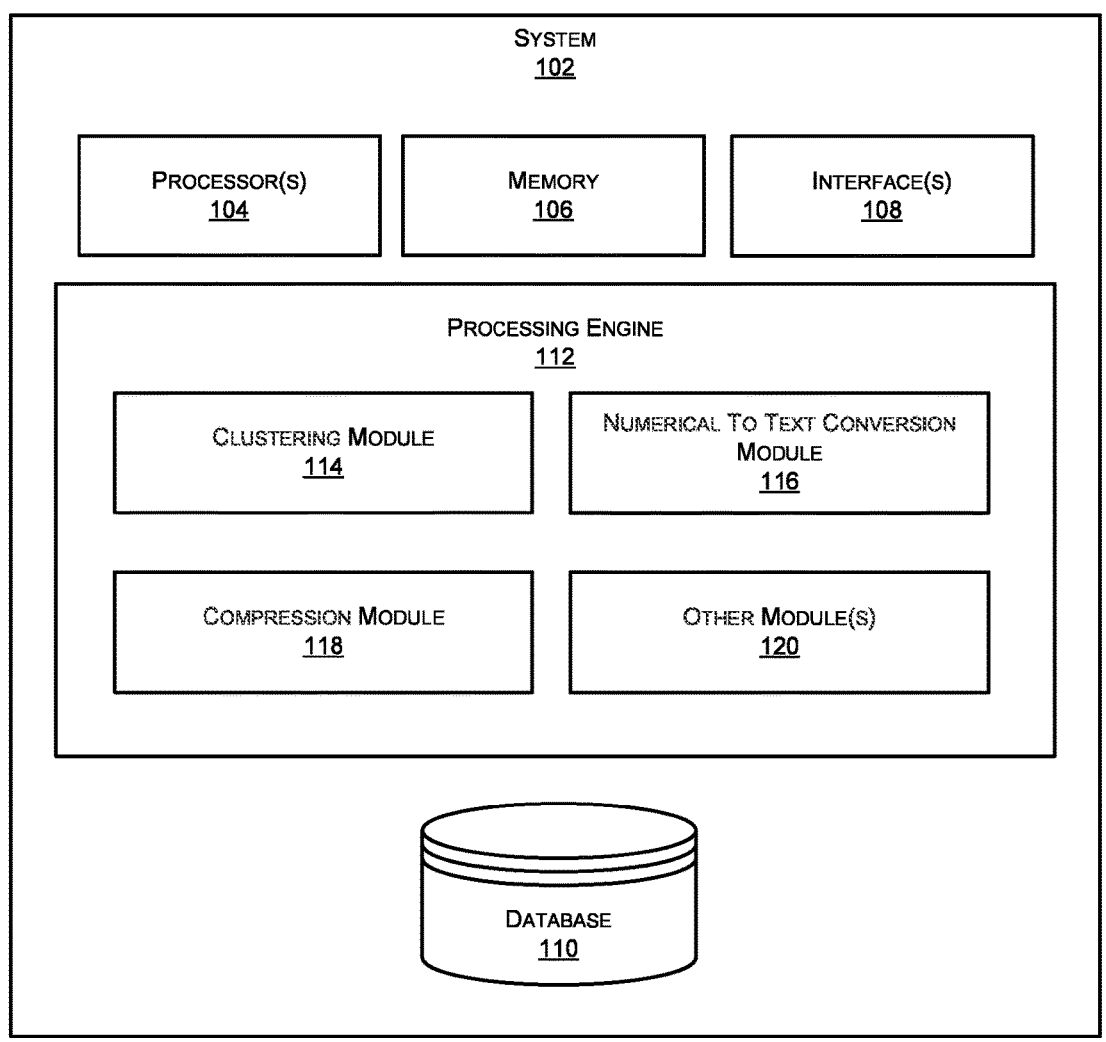
FIG. 1 illustrates an exemplary module diagram 100 of a system for compressing atmospheric data, in accordance with an embodiment of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within scope of the present disclosure as defined by the appended claims.

In the following description, numerous specific details are set forth in order to provide a thorough understanding of embodiments of the present invention. It will be apparent to one skilled in the art that embodiments of the present invention may be practiced without some of these specific details.

The present disclosure relates to the field of compression of atmospheric data. More particularly the present disclosure relates to near lossless compression of the atmospheric data.

The present disclosure elaborates upon a system for compression of a dataset having a plurality of data values. The system includes a processor coupled with a memory, the memory storing instructions executable by the processor to convert the plurality of data values in a first format to a second format. The second format is floating-point value format. Cluster a first segment of each of the plurality of data values in a first group, a second segment of each of the plurality of data in a second group, and a third segment of each of the plurality of data values in a third group. The first segment has common bits up to a length starting from a most significant bit of the plurality of data values before floating point, and the second segment has remaining bit of the plurality of data values before the floating point, and the third segment has bits of the plurality of data values after the floating point. The first segment of each of the plurality of data values lies within a first pre-defined range, the second segment of each of the plurality of data values lies within a second pre-defined range, the third segment of each of the plurality of data values lies within a third pre-defined range. Encode the first group, the second group, and the third group independently using a first technique to generate a corresponding first text file, second text file, and third text file. Compress the first text file, the second text file, and the third text file independently to generate a corresponding first compressed file, second compressed file, third compressed file using a second technique. Combine the first compressed file, the second compressed file, and the third compressed file to generate a complete compressed dataset.

In an embodiment, the plurality of data values can be very close to each other such that the plurality of data value when converted into floating point value format have at least two-bit common value, starting from the most significant bit, before the floating point.

In an embodiment, the first technique can include dictionary encoding technique.

In an embodiment, the first segment can be converted in to the first text file using first dictionary coding having range same as the pre-defined first range, the second segment can be converted in to the second text file using second dictionary coding having range same as the pre-defined second range, and the third segment can be converted in to third text file using third dictionary coding having range same as the pre-defined third range.

In an embodiment, the third group can be configured to accommodate the bits, up to two decimal places, of the plurality of data values after the floating point.

In an embodiment, the first second technique can include 7z technique.

In an embodiment, the complete compressed data (or dataset) can be converted back in to the dataset having plurality of values, by executing instruction stored in the memory that causes the processor to decompress the compressed data into the first text file, the second text file, and the third text file using the second technique. Decode the first text file, and the second text file, and the third file to generate the corresponding first segment of the second format, the second segment of the second format, and the third segment of the second point format using the first technique. The first segment can be in the first group, the second segment can be in the second group, and the third segment can be in the third group. Separating the first segment, the second segment, and the third segment from the first group, the second group, and the third group. Converting the second the plurality of the data values from the second format into the first format to generate the dataset having plurality of values.

Yet another embodiment of the present disclosure relates to a method for compression of a dataset having a plurality of data values. The method includes converting, by a processor, the plurality of data values into a floating-point value format. Clustering, by the processor, a first segment of each of the plurality of data values in a first group, a second segment of each of the plurality of data in a second group, and a third segment of each of the plurality of data values in a third group. The first segment has common bits up to a length starting from a most significant bit of the plurality of data values before floating point, and the second segment has remaining bit of the plurality of data values before the floating point, and the third segment has bits of the plurality of data values after the floating point. Encoding, by the processor, the first group, the second group, and the third group independently using a first technique to generate a corresponding first text file, second text file, and third text file. Compressing, by the processor, the first text file, the second text file, and the third text file independently to generate a corresponding first compressed file, second compressed file, third compressed file using a second technique. Combining, by the processor, the first compressed file, the second compressed file, and the third compressed file to generate a complete compressed dataset. The first segment of each of the plurality of data values lies within a first pre-defined range, the second segment of each of the plurality of data values lies within a second pre-defined range, the third segment of each of the plurality of data values lies within a third pre-defined range.

In an embodiment, the complete compressed data can be converted back into original sea level pressure data by decompress the compressed data into the first text file, the second text file, and the third text file using 7z decompression technique. Decoding the first text file, and the second text file, and the third file to generate the corresponding first segment of the second format, the second segment of the second format, and the third segment of the second point format using dictionary decoding technique, wherein the first segment is in the first group, the second segment is in the second group, the third segment is in the third group. Separating the first segment, the second segment, and the third segment from the first group, the second group, and the third group. Combining the first segment, the second segment, and the third segment to generate the dataset having plurality of values.

FIG. 1 illustrates an exemplary module diagram 100 of a system for compressing atmospheric data, in accordance with an embodiment of the present disclosure.

In an aspect, a system 102 for compression of atmospheric data can include one or more processor(s) 104. The one or more processor(s) 104 may be implemented as one or more microprocessors, microcomputers, microcontrollers, digital signal processors, central processing units, logic circuitries, and/or any devices that manipulate data based on operational instructions. Among other capabilities, the one or more processor(s) 104 are configured to fetch and execute computer-readable instructions stored in a memory 106 of the system 102. The memory 106 may store one or more computer-readable instructions or routines, which may be fetched and executed to create or share the data units over a network service. The memory 106 may comprise any non-transitory storage device including, for example, volatile memory such as RAM, or non-volatile memory such as EPROM, flash memory, and the like.

The system 102 may also comprise an interface(s) 108. The interface(s) 108 may comprise a variety of interfaces, for example, interfaces for data input and output devices, referred to as I/O devices, storage devices, and the like. The interface(s) 108 may facilitate communication of system 102. The interface(s) 108 may also provide a communication pathway for one or more components of the system 102. Examples of such components include, but are not limited to, processing engine(s) 112 and data 110. For example, The processing engine(s) 112 may be implemented as a combination of hardware and programming (for example, programmable instructions) to implement one or more functionalities of the processing engine(s) 112. In examples described herein, such combinations of hardware and programming may be implemented in several different ways. For example, the programming for the processing engine(s) 112 may be processor executable instructions stored on a non-transitory machine-readable storage medium and the hardware for the processing engine(s) 112 may comprise a processing resource (for example, one or more processors), to execute such instructions. In the present examples, the machine-readable storage medium may store instructions that, when executed by the processing resource, implement the processing engine(s) 112. In such examples, the system 102 may comprise the machine-readable storage medium storing the instructions and the processing resource to execute the instructions, or the machine-readable storage medium may be separate but accessible to system 102 and the processing resource. In other examples, the processing engine(s) 112 may be implemented by electronic circuitry.

The data 110 may comprise data that is either stored or generated as a result of functionalities implemented by any of the components of the processing engine(s) 112 or the system 102. The system 102 can be used to compress an atmospheric data (also referred as dataset, herein) that can be received from a public source such as but not limited to National Centers for Environmental Prediction (NCEP) Global Forecast System (GFS) Atmospheric Model forecast data. The dataset can include but without limiting to a sea level pressure. The atmospheric data is in GRIdded Binary "GRIB" format (also referred as the first format, herein), available in public domain. Sea level pressure (slp) data has been used here for illustration purpose. The sea level pressure data can be in a range 850 hpa-1050 hpa. The seal level pressure data can include multiple values at different times. The multiple values (also referred as plurality of values or plurality of data values, herein) can be very close to each other such that the plurality of values when converted into floating point value format have at least two-bit common value, starting from the most significant bit, before the floating point. The GRIB format of the atmospheric data initially can be converted into a second format that is a floating-point value format.

In an embodiment, the system 102 can include a clustering module 114 that can be used to cluster the floating-point data (also referred as floating-point value format) into a plurality of groups (also referred as buckets, herein) and generate a set of first signals. The clustering is performed such that a first group can include a first segment of the floating-point data of the multiple values. The first segment can refer to bits or digits of the floating-point data, corresponding to the multiple values of the seal level pressure data, that are common in the multiple values. The common bits (before the floating point or decimal) can be selected staring from most significant bit of the floating-point data up to a length till which the bits are common in the multiple values. For example, if the multiple values are 994.96, 995.85, and 996.45, the most significant bit for the disclosed floating-point data is 9 and the common bits (also referred as first segment) in all floating-point data is 99 for the floating-point data corresponding to multiple values. The length is equal to 2 digits since 99 is common in all floating-point data and is two-digit number. Thus, the first group can include 99, 99, 99 for the floating-point data (994.96, 995.85, and 996.45).

In an embodiment, a second group can include a second segment of the floating-point data. The second segment can refer to remaining bit (before the floating point) of the floating-point data that is 4, 5, 6. A third group can include a third segment of the floating-point data. The third segment can refer to bit (after the floating point) of the floating-point up to two decimal places data that is 96, 85, 45. The first segment of each of the plurality of data values can have a first pre-defined range of 85-105 to accommodate the first segment. The second segment of each of the plurality of data values can have a second pre-defined range of 0-9 to accommodate the second segment. The third segment of each of the plurality of data values can have a third predefined range of 00-99 to accommodate the third segment. In another example if the multiple values are 1003.45, 1004.37, and 1005.89, the first group will have 100, 100, 100, the second group will have 3, 4 5, and the third group will have 45, 37, 89. And the length in this case is 3 since 100 is three-bit number.

In an embodiment, the system can include a numerical to text conversion module 116 that can be configured to receive the set of first signals and individually covert the first group, the second group, and the third group into a corresponding first text file, a second text file, and a third text file. The text conversion engine can use but without limiting to dictionary coding technique for this conversion. A first dictionary coding of a similar 85-105 range as that of the first group can be used to convert the first segment in to the first text file. A second dictionary coding of a similar 0-9 range as that of the second group can be used to convert the second segment in to the second text file. A third dictionary coding of a similar 00-99 range as that of the third group can be used to convert the third segment in to the third text file. The numerical to text conversion module 116 can generate a set of second signals pertaining to the text files. The dictionary coding or decoding technique is a kind of near lossless data compression technique that is used search matches between the numerical values to be compressed and convert them into corresponding text values and vice versa.

In an embodiment, the system 102 can include a compression module 118 that can be configured to receive the set of second signals and compress the first text file, the second text file, and the third text file into corresponding first compressed file, a second compressed file, and a third compressed file. The compression module 118 can used but without limiting to 7z compression technique. Further, all the first compressed file, the second compressed file, and the third compressed file are combined together to form a complete compressed data. The 7z compression technique is widely used for compression of several types of data. The discussed compression technique has better compression ratio than conventional compression techniques. Table 1 illustrates a comparison between the conventional and proposed compression technique.

TABLE 1

| Grib2 Data Size | Text Data Size | Text Data + 7z compression size | Bucketing Method + 7z Compression Size |
| --- | --- | --- | --- |
| 2.7 MB | 10.1 MB | 2.06 MB | 1.39 MB |

In an embodiment, the complete compressed data can be transmitted to a receiving system, that further reconverted in to original sea level pressure data. The step processor can divide the complete compressed data in to plurality of groups. The divide compressed data can be decompressed into respective first text file, the second text file, and the third text file using 7z decompression technique. The de-compressed first text file, the second text file, and the third file can be decoded into corresponding numerical values (floating-point format) to generate the corresponding first segment of the second format, the second segment of the second format, and the third segment of the second point format using dictionary decoding technique. Further, the first segment, the second segment, and the third segment can be separated from the respective first group, second group, and third group. Finally, the separated segments can be combined together to generate the original sea level pressure data.

Figure 2:
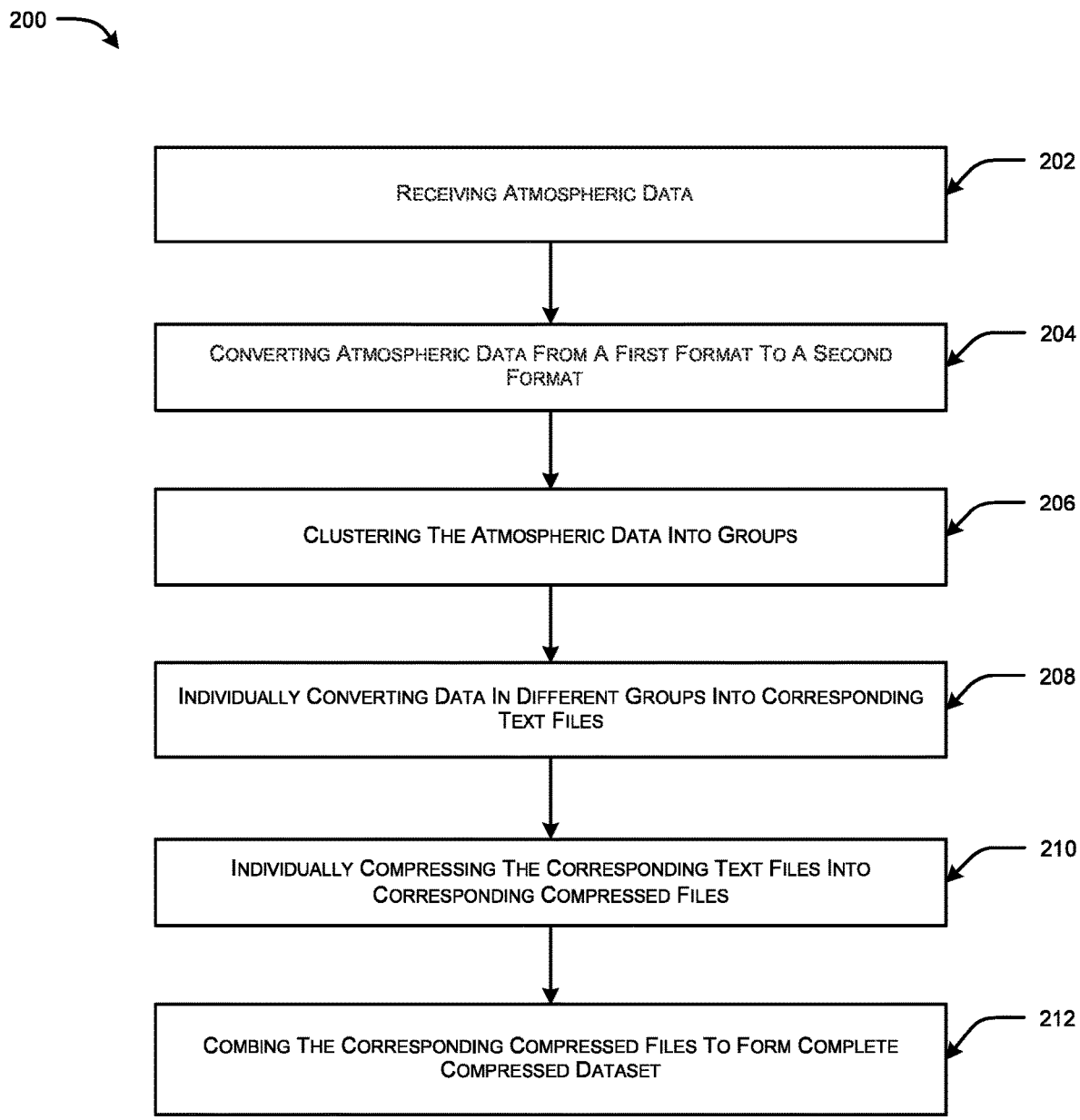
FIG. 2 illustrates a method for compressing atmospheric data, in accordance with an embodiment of the present disclosure.

FIG. 2 illustrates a method for compressing atmospheric data, in accordance with an embodiment of the present disclosure.

As illustrated, at step 202, proposed method 200 can include receiving atmospheric data. At step 204, the proposed method 200 can convert the atmospheric data that is conventionally in GRIB format (also referred as first format, herein) into a floating-point value format (also referred as second format, herein). The atmospheric data can be received from public source such as but without limiting to National Centers for Environmental Prediction (NCEP) Global Forecast System (GFS) Atmospheric Model forecast data.

At step 206, the method 200 can include clustering a first segment of each of the plurality of data values in a first group, a second segment of each of the plurality of data in a second group, and a third segment of each of the plurality of data values in a third group. The first segment has common bits up to a length starting from a most significant bit of the plurality of data values before floating point, and the second segment has remaining bit of the plurality of data values before the floating point, and the third segment has bits of the plurality of data values after the floating point. The first segment of each of the plurality of data values lies within a first pre-defined range, the second segment of each of the plurality of data values lies within a second pre-defined range, the third segment of each of the plurality of data values lies within a third pre-defined range At step 208, the method 200 can include encoding (numerical to text) the first group, the second group, and the third group independently using a first technique to generate a corresponding first text file, second text file, and third text file. The first technique can include but not limited to dictionary coding technique.

At step 210, the method 200 can include compressing the first text file, the second text file, and the third text file independently to generate a corresponding first compressed file, second compressed file, third compressed file using a second technique. The second technique can include but not limited to 7z compression technique.

At step 212, the method 200 can include combining the first compressed file, the second compressed file, and the third compressed file to generate a complete compressed dataset.

In an embodiment, the complete compressed data can be converted back into original sea level pressure data (dataset having plurality of values) by decompress the compressed data into the first text file, the second text file, and the third text file using 7z decompression technique. Decoding the first text file, and the second text file, and the third file to generate the corresponding first segment of the second format, the second segment of the second format, and the third segment of the second point format using dictionary decoding technique, wherein the first segment is in the first group, the second segment is in the second group, the third segment is in the third group. Separating the first segment, the second segment, and the third segment from the first group, the second group, and the third group. Combining the first segment, the second segment, and the third segment to generate the dataset having plurality of values.

Figure 3:
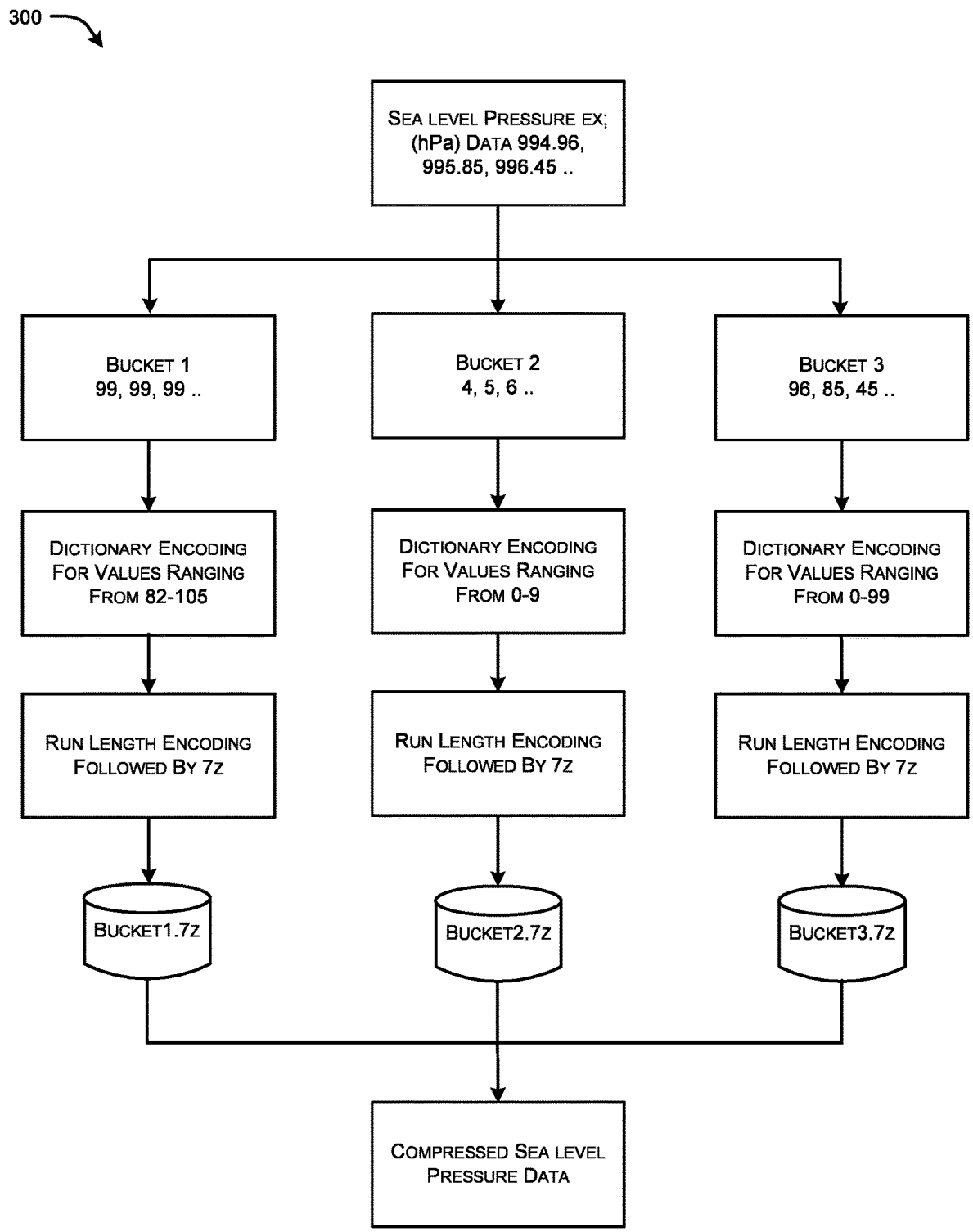
FIG. 3 illustrates compression of an exemplary atmospheric data, in accordance with an embodiment of the present disclosure.

FIG. 3 illustrates compression 300 of an exemplary atmospheric data, in accordance with an embodiment of the present disclosure.

As illustrated, data 994.96, 995.85, and 996.45 is divided into three groups (also referred as buckets, herein). Further this divide data is converted into respective text form before compression using dictionary coding technique. After conversion, the respective text forms are compressed individually and later combined to form the complete compressed data.

Figure 4:
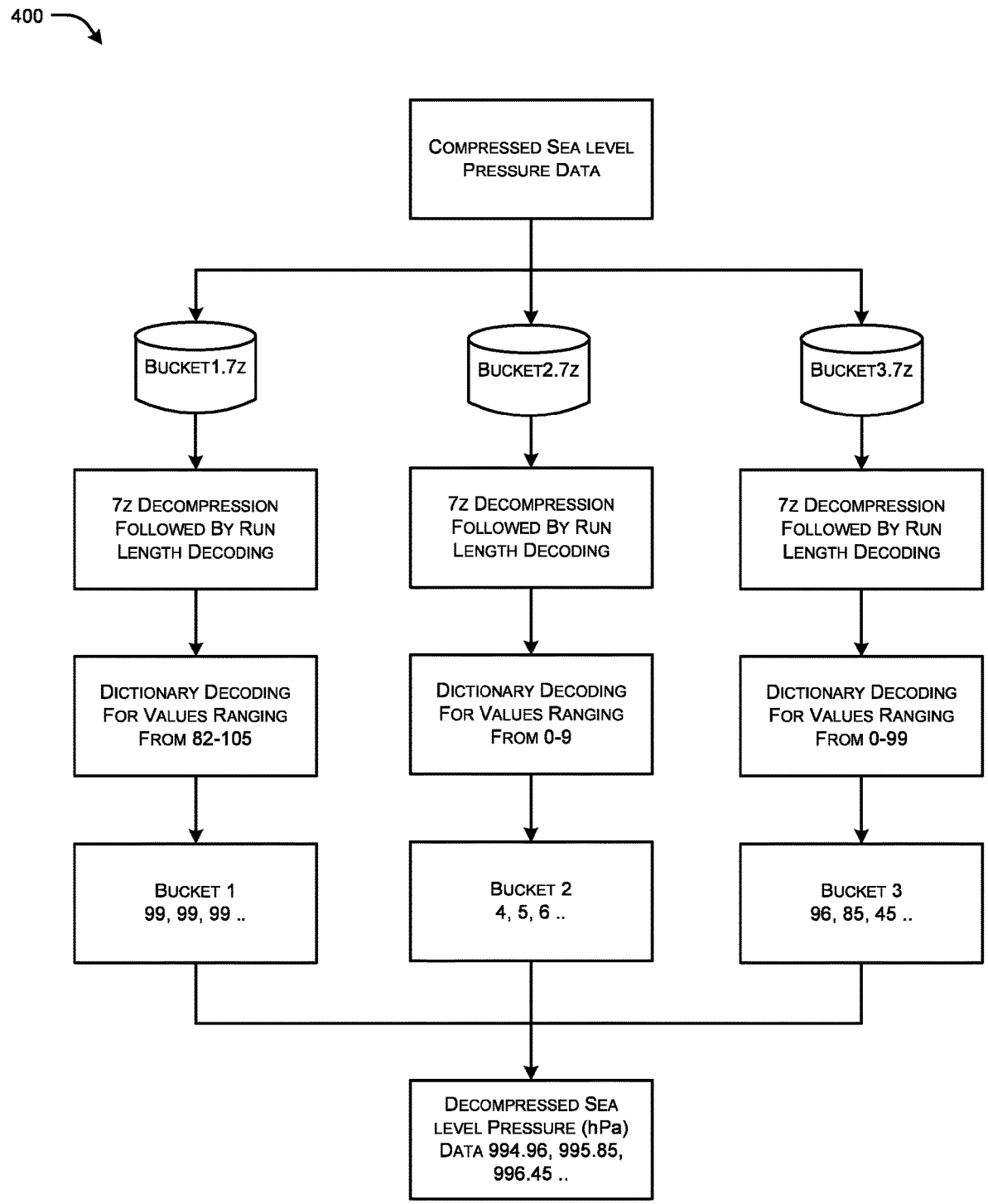
FIG. 4 illustrates de-compression of an exemplary atmospheric data, in accordance with an embodiment of the present disclosure.

FIG. 4 illustrates de-compression 400 of an exemplary atmospheric data, in accordance with an embodiment of the present disclosure.

As illustrated, compressed data can be divides into groups and can be decompressed using 7z technique to generate corresponding text files. The corresponding text files can be converted into corresponding numerical values (second format) using dictionary decoding technique, then later the corresponding numerical values can be combined together to form original seal level pressure data (atmospheric data).

Figure 5:
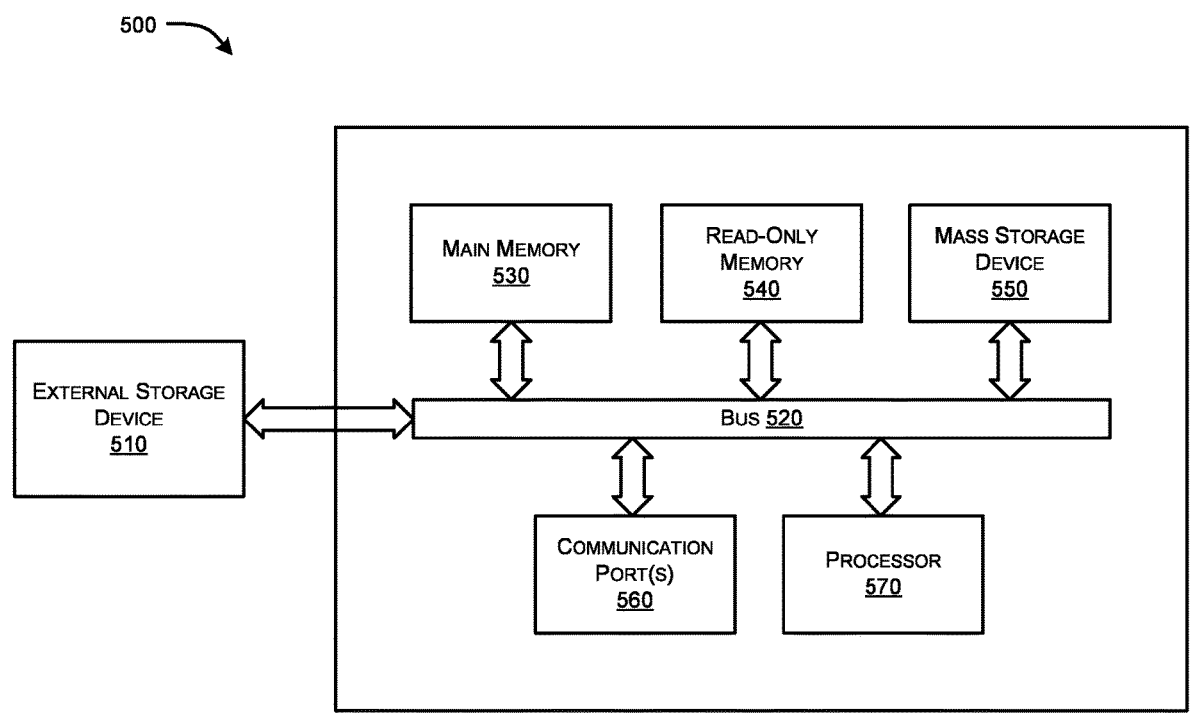
FIG. 5 illustrates an exemplary computer system in which or with which embodiments of the present invention can be utilized, in accordance with embodiments of the present disclosure.

FIG. 5 illustrates an exemplary computer system in which or with which embodiments of the present invention can be utilized, in accordance with embodiments of the present disclosure.

As shown in FIG. 5, computer system 500 can include an external storage device 510, a bus 520, a main memory 530, a read only memory 540, a mass storage device 550, communication port 560, and a processor 570. A person skilled in the art will appreciate that the computer system may include more than one processor and communication ports. Examples of processor 570 include, but are not limited to, an Intel® Itanium® or Itanium 2 processor(s), or AMD® Opteron® or Athlon MP® processor(s), Motorola® lines of processors, FortiSOC™ system on chip processors or other future processors. Processor 570 may include various modules associated with embodiments of the present invention. Communication port 560 can be any of an RS-232 port for use with a modem-based dialup connection, a 10/100 Ethernet port, a Gigabit or 10 Gigabit port using copper or fiber, a serial port, a parallel port, or other existing or future ports. Communication port 560 may be chosen depending on a network, such a Local Area Network (LAN), Wide Area Network (WAN), or any network to which computer system connects.

Memory 530 can be Random Access Memory (RAM), or any other dynamic storage device commonly known in the art. Read-only memory 540 can be any static storage device(s) e.g., but not limited to, a Programmable Read Only Memory (PROM) chips for storing static information e.g., start-up or BIOS instructions for processor 570. Mass storage 550 may be any current or future mass storage solution, which can be used to store information and/or instructions. Exemplary mass storage solutions include, but are not limited to, Parallel Advanced Technology Attachment (PATA) or Serial Advanced Technology Attachment (SATA) hard disk drives or solid-state drives (internal or external, e.g., having Universal Serial Bus (USB) and/or Firewire interfaces), e.g. those available from Seagate (e.g., the Seagate Barracuda 7102 family) or Hitachi (e.g., the Hitachi Deskstar 7K1000), one or more optical discs, Redundant Array of Independent Disks (RAID) storage, e.g. an array of disks (e.g., SATA arrays), available from various vendors including Dot Hill Systems Corp., LaCie, Nexsan Technologies, Inc. and Enhance Technology, Inc.

Bus 520 communicatively couple's processor(s) 570 with the other memory, storage and communication blocks. Bus 520 can be, e.g. a Peripheral Component Interconnect (PCI)/ PCI Extended (PCI-X) bus, Small Computer System Interface (SCSI), USB or the like, for connecting expansion cards, drives and other subsystems as well as other buses, such a front side bus (FSB), which connects processor 570 to software system.

Optionally, operator and administrative interfaces, e.g. a display, keyboard, and a cursor control device, may also be coupled to bus 520 to support direct operator interaction with a computer system. Other operator and administrative interfaces can be provided through network connections connected through communication port 560. The external storage device 510 can be any kind of external hard-drives, floppy drives, IOMEGA® Zip Drives, Compact Disc-Read Only Memory (CD-ROM), Compact Disc-Re-Writable (CD-RW), Digital Video Disk-Read Only Memory (DVD-ROM). Components described above are meant only to exemplify various possibilities. In no way should the aforementioned exemplary computer system limit the scope of the present disclosure.

Moreover, in interpreting the specification, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . and N, the text should be interpreted as requiring only one element from the group, not A plus N, or B plus N, etc.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The proposed invention provides a system and method for compressing sea level pressure data which is capable of further compressing GRIB format data.

The proposed invention provides a system and method for compressing sea level pressure data which is more efficient.

The proposed invention provides a and method for compressing sea level pressure data which is cost effective in terms of storage space required to store data.

The proposed invention provides a system and method for compressing sea level pressure data which is easy to implement using already existing compression technique.

The invention claimed is:

1. A system for compression of a dataset having a plurality of data values, the system comprising:
a processor coupled with a memory, the memory storing instructions executable by the processor to:
convert the plurality of data values in a first format to a second format, wherein the second format is floating-point value format;
cluster a first segment of each of the plurality of data values in a first group, a second segment of each of the plurality of data in a second group, and a third segment of each of the plurality of data values in a third group, wherein the first segment has common bits, starting from a most significant bit, of the plurality of data values before floating point, and the second segment has remaining bit of the plurality of data values lies before the floating point, and the third segment has bits of the plurality of data values lies after the floating point, wherein the first segment of each of the plurality of data values lies within a first pre-defined range, the second segment of each of the plurality of data values lies within a second pre-defined range, the third segment of each of the plurality of data values lies within a third pre-defined range;
encode the first group, the second group, and the third group independently using a first technique to generate a corresponding first text file, second text file, and third text file;
compress the first text file, the second text file, and the third text file independently to generate a corresponding first compressed file, second compressed file, third compressed file using a second technique; and
combine the first compressed file, the second compressed file, and the third compressed file to generate a complete compressed dataset.

2. The system as claimed in claim 1, wherein the plurality of data values are very close to each other such that the plurality of data value when converted into floating point value format have at least two-bit common value, starting from the most significant bit, before the floating point.

3. The system as claimed in claim 1, wherein the first technique comprises dictionary encoding technique.

4. The system as claimed in claim 1, wherein the first segment is converted in to the first text file using first dictionary coding having range same as the pre-defined first range, the second segment is converted in to the second text file using second dictionary coding having range same as the pre-defined second range, and the third segment is converted in to third text file using third dictionary coding having range same as the pre-defined third range.

5. The system as claimed in claim 1, wherein the third group is configured to accommodate the bits, up to two decimal places, of the plurality of data values after the floating point.

6. The system as claimed in claim 1, wherein the second technique comprises any or combination of 7z technique, and run length encoding.

7. The system as claimed in claim 1, wherein the complete compressed data is converted back in to the dataset having plurality of values, by executing instruction stored in the memory that causes the processor to:
decompress the compressed data into the first text file, the second text file, and the third text file using 7z decompression technique followed by run length decoding technique;
decode the first text file, and the second text file, and the third file to generate the corresponding first segment of the second format, the second segment of the second format, and the third segment of the second point format using dictionary decoding technique, wherein the first segment is in the first group, the second segment is in the second group, the third segment is in the third group;
separate the first segment, the second segment, and the third segment from the first group, the second group, and the third group; and
combine the first segment, the second segment, and the third segment to generate the dataset having plurality of data values.

8. A method for compression of a dataset having a plurality of data values, the method comprising:
- converting, by a processor, the plurality of data values into a floating-point value format;
- clustering, by the processor, a first segment of the plurality of data values in a first group, a second segment of the plurality of data in a second group, and a third segment of the plurality of data values in a third group, wherein the first segment of each of the plurality of data has common bits starting from a most significant bit of the plurality of data values before floating point, and the second segment of each of the plurality of data has remaining bit of the plurality of data values before the floating point, and the third segment of each of the plurality of data has bits of the plurality of data values after the floating point, wherein the first segment of each of the plurality of data values lies within a first pre-defined range, the second segment of each of the plurality of data values lies within a second pre-defined range, the third segment of each of the plurality of data values lies within a third pre-defined range;
- encoding, by the processor, the first group, the second group, and the third group independently using a first technique to generate a corresponding first text file, second text file, and third text file;
- compressing, by the processor, the first text file, the second text file, and the third text file independently to generate a corresponding first compressed file, second compressed file, third compressed file using a second technique; and
- combining, by the processor, the first compressed file, the second compressed file, and the third compressed file to generate a complete compressed dataset.

9. The method as claimed in claim 8, wherein the complete compressed data is converted back into the dataset having plurality of values by:
- decompress the compressed data into the first text file, the second text file, and the third text file using 7z decompression technique and run length decoding technique;
- decoding the first text file, and the second text file, and the third file to generate the corresponding first segment of the second format, the second segment of the second format, and the third segment of the second point format using dictionary decoding technique, wherein the first segment is in the first group, the second segment is in the second group, the third segment is in the third group;
- separating the first segment, the second segment, and the third segment from the first group, the second group, and the third group; and
- combining the first segment, the second segment, and the third segment to generate the dataset having plurality of data values.

* * * * *